US011120182B2

(12) United States Patent
Lin et al.

(10) Patent No.: US 11,120,182 B2
(45) Date of Patent: Sep. 14, 2021

(54) METHODOLOGY OF INCORPORATING WAFER PHYSICAL MEASUREMENT WITH DIGITAL SIMULATION FOR IMPROVING SEMICONDUCTOR DEVICE FABRICATION

(71) Applicant: Applied Materials, Inc., Santa Clara, CA (US)

(72) Inventors: Jason Zse-cherng Lin, Saratoga, CA (US); Shauh-Teh Juang, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 139 days.

(21) Appl. No.: 16/526,845

(22) Filed: Jul. 30, 2019

(65) Prior Publication Data

US 2019/0384882 A1 Dec. 19, 2019

Related U.S. Application Data

(63) Continuation of application No. 14/607,352, filed on Jan. 28, 2015, now abandoned.

(51) Int. Cl.
*G06F 30/30* (2020.01)
(52) U.S. Cl.
CPC .................... *G06F 30/30* (2020.01)
(58) Field of Classification Search
CPC .......... G06F 30/30; G06F 30/31; G06F 30/32; G06F 30/323; G06F 30/333;
(Continued)

(56) References Cited

U.S. PATENT DOCUMENTS 7,302,091 B2  11/2007  Hamaguchi et al.
7,769,225 B2   8/2010  Kekare et al.
(Continued)

FOREIGN PATENT DOCUMENTS

CN  101252097 A  8/2008
CN  101308517 A  11/2008

OTHER PUBLICATIONS

Zhang, Daniel, and Lawrence Melvin. "Model-based lithography verification using the new manufacturing sensitivity model." In Photomask Technology 2006, vol. 6349, p. 63494Q. International Society for Optics and Photonics, 2006. (Year: 2006).*

(Continued)

*Primary Examiner* — Chuen-Meei Gan
(74) *Attorney, Agent, or Firm* — Patterson + Sheridan LLP

(57) ABSTRACT

A hot spot methodology incorporates wafer physical measurement with digital simulation for identifying and monitoring critical hot spots. Wafer physical data are collected from the processed wafer of the semiconductor device on a plurality of target locations. Hot spot candidates and corresponding simulation data are generated by digital simulation based on models and verifications of optical proximity and lithographic process correction according to the design data of a semiconductor device. Data analytics provides data correlation between the collected wafer physical data and the simulation data. Data analytics further performs data correction on the simulation data according to the wafer physical data that have best correlation with the simulation data to better predict critical hot spots.

20 Claims, 4 Drawing Sheets

(58) Field of Classification Search
CPC ...... G06F 30/337; G06F 30/34; G06F 30/343;
G06F 30/347; G06F 30/38; G06F
2111/00; G06F 2119/22
See application file for complete search history.

(56) References Cited

U.S. PATENT DOCUMENTS

| | | | |
|---|---|---|---|
| 7,937,179 | B2 | 5/2011 | Shimshi et al. |
| 7,962,864 | B2 | 6/2011 | Nehmadi et al. |
| 7,991,497 | B2 | 8/2011 | Lin et al. |
| 8,139,844 | B2 | 3/2012 | Chen et al. |
| 2006/0062445 | A1 | 3/2006 | Verma et al. |
| 2006/0123380 | A1 | 6/2006 | Ikeuchi |
| 2007/0052963 | A1* | 3/2007 | Orbon .................. G03F 1/84 356/430 |
| 2008/0163140 | A1 | 7/2008 | Fouquet et al. |
| 2009/0024967 | A1 | 1/2009 | Su et al. |
| 2009/0144691 | A1* | 6/2009 | Rathsack ............ H01L 22/20 716/56 |
| 2011/0230998 | A1 | 9/2011 | Liu et al. |
| 2012/0053892 | A1* | 3/2012 | Matsuoka ........... G03F 7/70633 702/167 |
| 2013/0326439 | A1* | 12/2013 | Matsuoka ............... G06F 30/00 716/55 |

OTHER PUBLICATIONS http://www.lithoguru.com/scientist/glossary/E.html Chris A. Mack; Glossary of Lithography Terms—E webpage; 2006-2017.
Tyminski et al., Lithographic imaging-driven pattern edge placement errors at the 10-nm node, SPI E, Apr.-Jun. 20106, vol. 15(2).
Taiwan Patent Application No. 2015101412376, Search Report, 1 page.
Taiwan Application No. 201510141237.6, Second Office Action w/translation, dated Jan. 3, 2019, 32 pages.
Taiwan Application No. 201510141237.6, Third Office Action w/translation, dated Sep. 3, 2019, 30 pages.
Chinese Application No. 201510141237.6, Notification of Granting Invention Patent Right and Search Report dated Dec. 4, 2019, 8 pages.

* cited by examiner

METHODOLOGY OF INCORPORATING WAFER PHYSICAL MEASUREMENT WITH DIGITAL SIMULATION FOR IMPROVING SEMICONDUCTOR DEVICE FABRICATION

CROSS-REFERENCE TO RELATED APPLICATIONS

This application is a continuation of patent application Ser. No. 14/607,352, filed on Jan. 28, 2015, which is herein incorporated by reference in its entirety.

FIELD OF THE INVENTION

The present invention relates generally to semiconductor device fabrication, and more specifically to a method for improving lithographic process in manufacturing semiconductor device.

DESCRIPTION OF RELATED ART

Semiconductor devices are manufactured by fabricating many layers of circuit patterns on wafers to form massive transistors for integration as complicated circuits. In the manufacturing flow of semiconductor devices, lithographic process is responsible for transferring circuit patterns created by circuit designers onto wafers.

Photomasks with opaque and clear patterns according to the circuit patterns are used for patterning device layers on wafers. Distortion of the patterns can result from the effect of the neighboring patterns on the photomask and optical diffraction, chemical-mechanical polishing (CMP) on adjacent layers of the wafer, and geometric and overlaying relationships between patterns of adjacent layers fabricated on the wafer. As the component density of the integrated circuits (ICs) has increased the complexity of the IC patterns and layouts, distortion of the patterns often results in systematic defects that fail the device fabricated on the wafer or critical dimension (CD) errors that degrade the device performance.

FIG. 1 shows a typical flow in initial setup and on-going tune-up for optimizing the lithography process of manufacturing semiconductor devices. Circuit patterns for manufacturing the photomask of a device layer is described in a design data file generated by the circuit designer shown in block 101 that contains design data in GDS or OASIS format. The design data may be random logic circuit patterns generated from random logic generator (RLG) or product qualification vehicle (PQV) from vendors or pilot customers. Block 102 shows optical proximity correction (OPC) creation that generates the required OPC by using the OPC model and recipe from block 103. After OPC creation, block 102 also performs OPC verification and lithographic process check (LPC) verification based on models of OPC and design for manufacturing (DFM).

OPC and LPC verification also predicts potential yield limiting hot spots caused by specific layout and patterns. As shown in block 104, wafers manufactured by the lithography process using the OPC photomask are examined by either optical or e-beam inspection and metrology tool to detect defects and measure critical dimensions in the hot spots. Inspection and metrology data of the predicted hot spots are fed back to block I 03 to tune the models and recipes of OPC and DFM. In general, it is not easy to achieve perfect OPC/DFM models/recipes because the patterning errors come from many proximity and underneath effects including optical, chemical, etching, CMP and other processes as well as photomask/reticle errors. Even worse, some effects are short range and some are long range.

OPC is effective in achieving linewidth control if optical conditions during lithography match the simulated optical conditions used to arrive at the OPC solution. Defocus and exposure dose variations result in linewidth variation even after OPC. Focus variation during lithography is caused by changes in resist thickness, wafer topography and relative distance between wafer plane and the lens system. The dose variation typically comes from the scanner or from the illumination in the optical lithography system. Depth of focus and exposure latitude define the process window of a lithography system. Latest advances in process window aware OPC guarantee acceptable lithography quality but linewidth still varies within the process window. Linewidth variation has a direct impact on timing and leakage of designs.

Lithographic process (LP) simulation is typically used to simulate the circuit patterns and predict hot spots that are likely to cause pattern distortion. CMP simulation may also be performed on the circuit layout to determine hot spots. Alternatively, physical failure analysis (PF A) may be performed on the devices to identify hot spots. OPC and LPC are important techniques commonly used for correcting the pattern distortion.

In practice, however, not all hot spots may result in systematic defects and not all systematic defects may be predicted as hot spots by the simulations. Process monitoring by sampling and inspecting wafers is necessary to ensure that systematic defects are identified and eliminated for manufacturing the semiconductor devices with high yield. One approach commonly used in process monitoring is to collect scanning electron microscopic (SEM) images from a significant number of hot spots by sampling dies and wafers in the manufacturing flow. The hot spots may be predicted by LPC, CMP, PF A or other experience and knowledge.

As the lithography is pushed to its utmost limits, various techniques and low k materials are used to drive the resolution and lower the linewidth. As a result, mask error enhancement factor (MEEF) is significantly increased, i.e., CD errors on mask are getting highly amplified on wafer. Poly-silicon linewidth variation in the advanced technology nodes is a major source of transistor performance variation and circuit parametric yield. It has been known that significant part of the observed variation is systematically impacted by the neighboring layout pattern within optical proximity. Design optimization should account for this variation in order to maximize the performance and manufacturability of chip designs.

In the process monitoring, it is critical to correct the pattern distortion once the hot spots have been determined to cause systematic defects by examining scanning electron microscope (SEM) images or PFA. However, as technology advances to 20 nm and beyond, designs are scaled down and the scaling down to small geometries has resulted in many systematic manufacturing variations that limit manufacturing yield more than the random variations. The interaction of small geometries within the optical proximity, processing proximity, . . . , and between adjacent layers makes it difficult to identify the root cause of the pattern distortion for correction.

SUMMARY

The present invention has been made to overcome the above mentioned challenge and deficiency in predicting and uncovering manufacturing critical hot spots for improving lithographic process of manufacturing semiconductor devices. Accordingly, the present invention provides a method for incorporating wafer physical measurement with digital simulation for identifying critical hot spots in semiconductor device fabrication.

In the present invention, data analytics is employed to identity correlation between wafer physical data and simulation data. The simulation data are then corrected based on the correlation to capture patterning errors caused by effects not predicted in the digital simulation. In one embodiment of the present invention, CD data are physical measurement acquired from the processed wafer of the semiconductor device and hot spot candidates are simulation data generated digitally from the design data of the semiconductor device based on OPC/LPC model, verification and other methods.

A number of CD targets are prepared in the design data of the semiconductor device. A plurality of hot spots according to OPC/LPC verification based on the design data of the semiconductor device and the OPC/DFM model is predicted as host spot candidates. CD data for the CD targets are measured on the wafer of the semiconductor device. Data analytics is performed based on the measured CD data and the hot spot candidates with reference to the design data to generate the critical hot spots for monitoring the manufactured wafer.

According to the present invention, the data analytics provides data correlation and correction between the measured CD data and the hot spot candidates to identify the critical hot spots from the hot spot candidates. In a preferred embodiment, the hot spot candidates are selected based on edge placement error data predicted from the OPC and LPC verification. Data correlation between the measured CD data and the predicted edge placement error data is preformed to calibrate the predicted edge placement data in order to identify critical hot spots.

In one embodiment, the predicted edge placement error is calibrated by the measured CD data of the CD targets whose locations have closest proximity with the locations corresponding to the predicted edge placement error data. In another embodiment, calibration of the predicted edge placement error is based on the measured CD data of the CD targets whose design data have best correlation with the design data corresponding to the predicted edge placement error data. In addition, data correlation and correction may also be based on corresponding optical or SEM images acquired from the wafer or simulated images modelled and rendered from the design data.

To cope with wafer to wafer variation and accomplish better accuracy, the critical hot spots can be generated and monitored in line while the inspection or metrology performed for the wafer is ongoing. A wafer process monitoring tool can be provided to perform both wafer inspection and metrology and the data analytics is executed in-line while the CD data using metrology is measured to dynamically identify the critical hot spots for monitoring with inspection. Furthermore, the defects and CD data obtained from monitoring the critical hot spots can be used to tune the OPC and DFM models and recipes in the initial setup or on-going tune-up.

BRIEF DESCRIPTION OF THE DRAWINGS

The present invention will be apparent to those skilled in the art by reading the following detailed description of preferred embodiments thereof, with reference to the attached drawings, in which.

DETAILED DESCRIPTION

Figure 1:
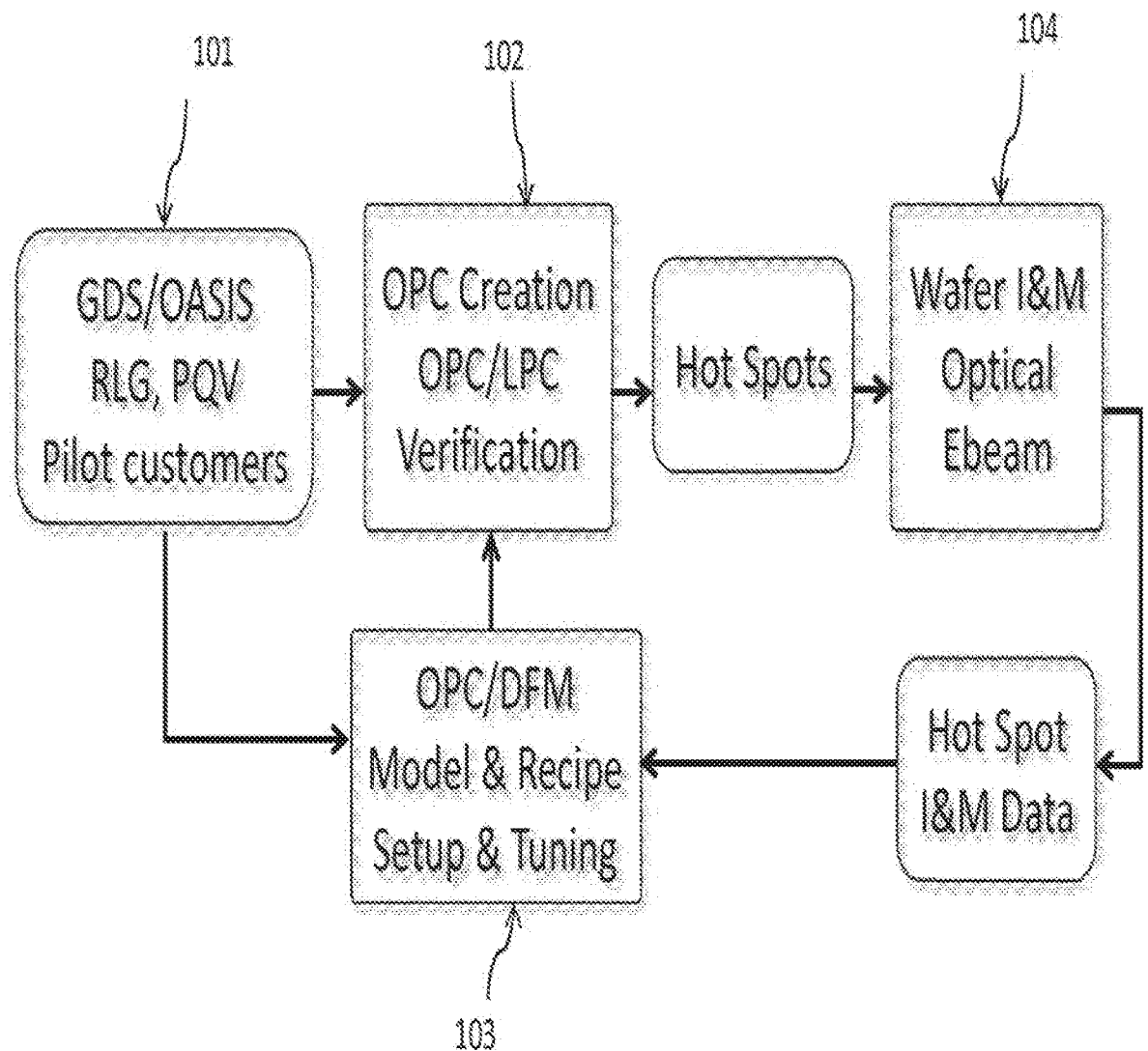
FIG. 1 shows a typical flow in initial setup and tuning for optimizing the lithography process of manufacturing semiconductor devices.
Figure 2:
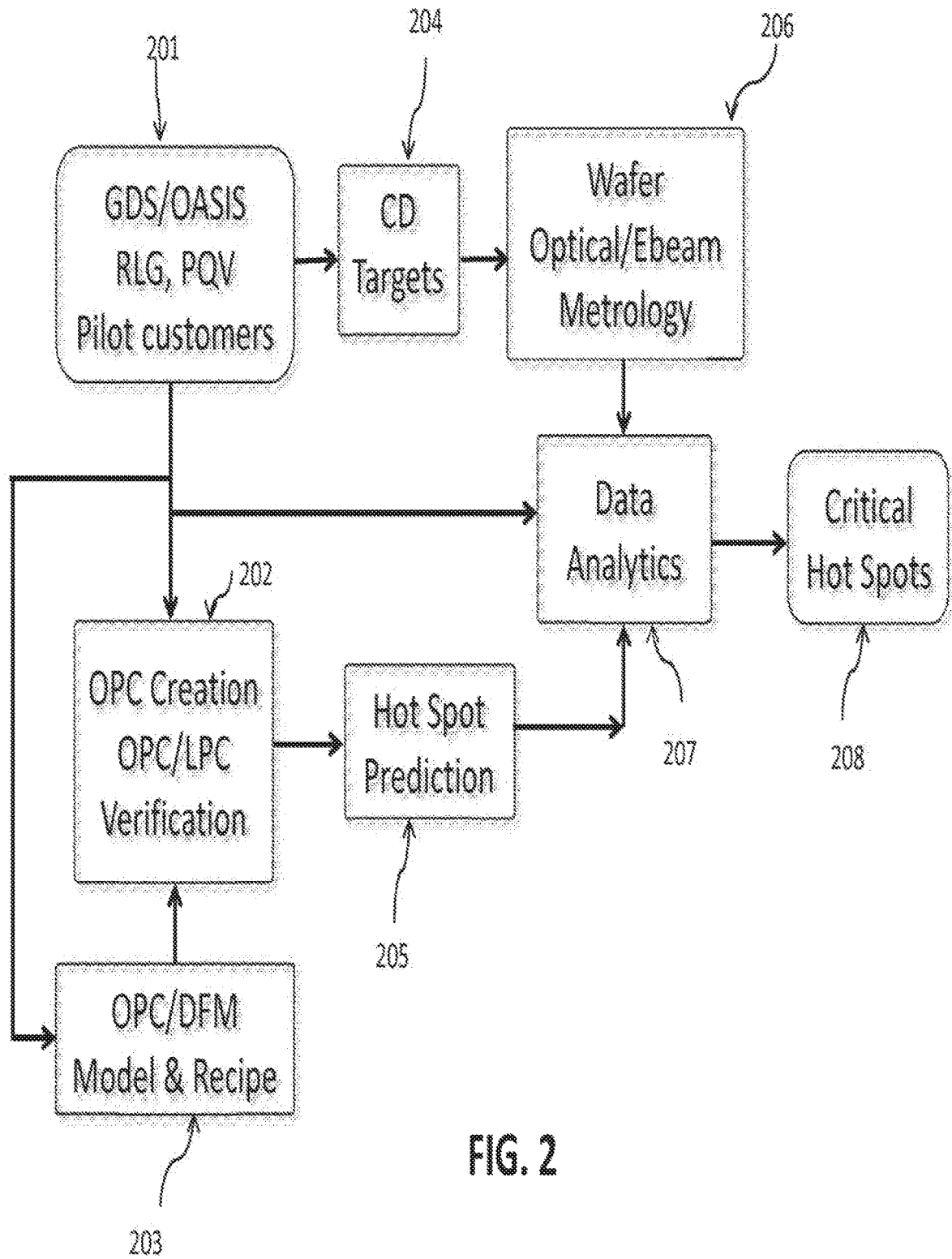
FIG. 2 shows critical hot spot identification using CD measurement, hot spot prediction and data analytics according to the present invention.

FIG. 2 shows a method of identifying critical hot spots for monitoring in manufacturing semiconductor devices according to the present invention. With reference to FIG. 2, a plurality of test structures is formed on the semiconductor wafer as CD targets to monitor the uniformity and variation of the CD data on the wafer.

As shown in FIG. 2, the required OPC is created by OPC creation 202 using the OPC and DFM model and recipe 203. CD targets 204 with expected critical dimension are manufactured on the wafer based on CD target patterns and locations described in the design data 201 in either GOS or OASIS formats. The physical CD data 207 are measured and acquired from the wafer using either optical or e-beam metrology 206.

OPC and LPC verification 202 based on OPC and DFM models has been widely used to predict hot spots. Hot spot candidates are often identified according to edge placement errors of circuit patterns predicted from the OPC and LPC verification 202. However, as pointed out earlier, it has been observed that some critical hot spots can no longer be predicted accurately based on OPC and DFM models as the linewidth is driven below 20 nanometers.

CD data are true physical data reflecting effects coming from all the proximity and underneath layers after the wafer is manufactured. Due to the available area in the designed chip and the time required to perform CD measurement, the number of CD targets is usually limited. Although there are variations and errors that are difficult to model, simulate and predict as the resolution and geometry are pushed to the limit, the edge placement errors still represent useful trends of how circuit patterns will be placed and printed on the wafer under the OPC and DFM models. It is also relatively easy to generate dense simulation data than measure large amount of CD data. Therefore, the methodology of the present invention is designed to incorporate the sparse CD data from wafer physical measurement with edge placement errors densely predicted from digital simulation to improve semiconductor device fabrication.

According to the present invention, hot spot candidates predicted based on OPC/LPC verification 202 are further fine-tuned and calibrated with the actual CD data. The output of hot spot prediction 205 also includes edge placement error data. Data analytics 207 is performed with both measured CD data from the optical ore-beam metrology 206 and edge placement error data from the hot spot prediction 205 as inputs with reference to the design data 201. In principle, edge placement error data represent simulated error data based on modeling and measured CD data represent true error data obtained from wafer physical measurement.

Figure 3:
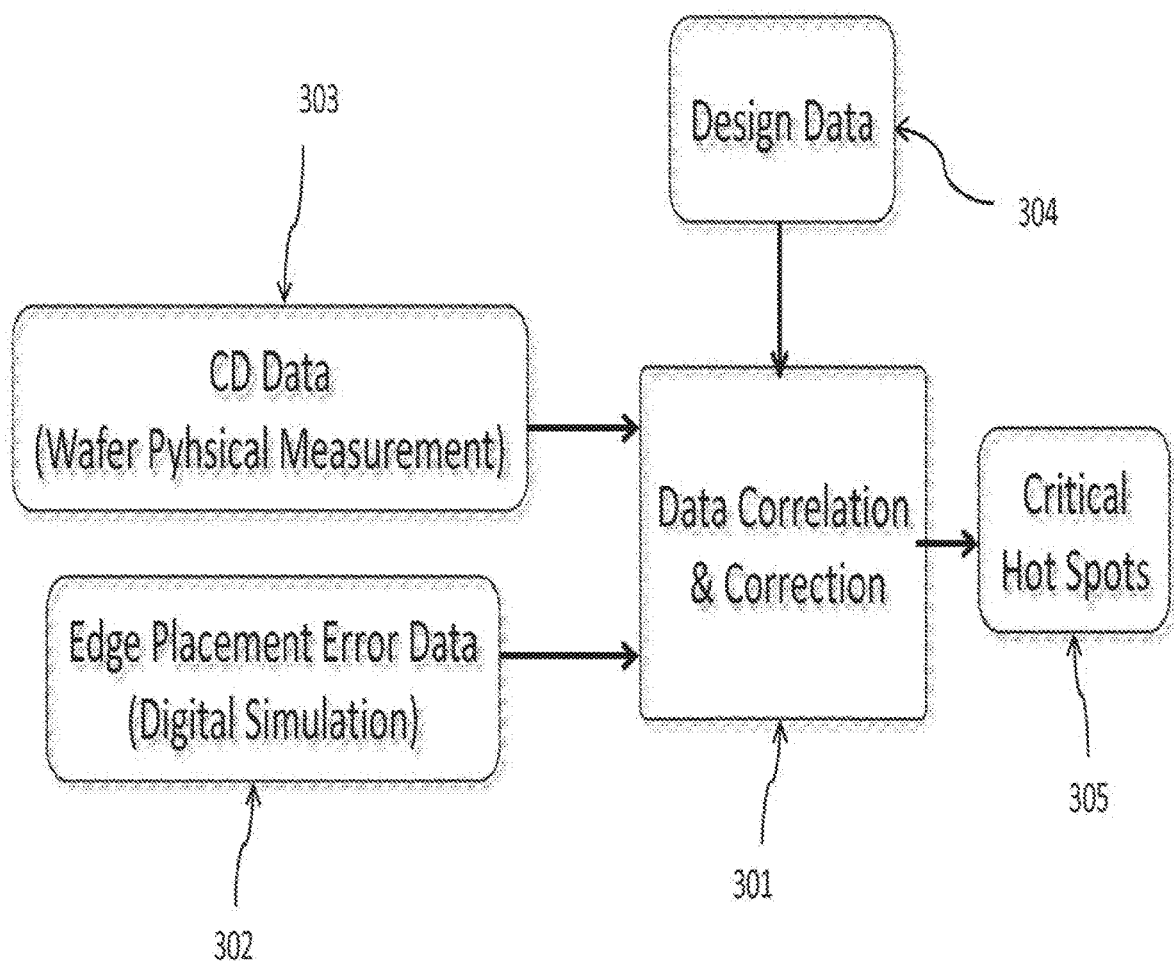
FIG. 3 shows the data analytics of critical hot spot identification by incorporating wafer physical measurement with digital simulation according to the present invention.

As shown in FIG. 3, data analytics of the present invention performs data correlation and correction 301 based on CD data 303 acquired from wafer physical measurement and edge placement error data 302 generated from digital simulation with reference to the design data 304 in order to determine critical hot spots 305 for monitoring.

The CD data measured from the plurality of CD targets may comprise a list of CD measurement data. Each entry of the CD measurement data at least includes the location, circuit pattern type, CD error and wafer zone information of the measured CD target. In addition, photomask or reticle field information may also be included in the CD measurement data to capture the patterning errors contributed by the photomask or reticle CD error. The edge placement error data comprise a list of locations and simulated edge placement errors of the corresponding locations.

It should be noted that the CD targets of the present invention for acquiring wafer physical measurement can be simple CD patterns placed and distributed over the full chip of the semiconductor device. The simple CD patterns may be placed at locations within a predetermined range of certain pattern proximity or underneath characteristics such as density, orientation, vertex, line end, and split for multiple patterning to capture their effects. The CD targets may also be existing device circuit patterns selected from the design data based on certain pattern proximity or underneath characteristics.

In the data analytics of the present invention, the data correlation and correction between the CD data and the edge placement error data can be accomplished with a few different approaches. In one embodiment, the correlation is based on the location proximity between the two sets of data. For example, for each entry in the edge placement error data, the closest CD target can be identified. In order to predict more accurate edge placement error data on the wafer, the simulated edge placement error data can be calibrated according to the CD error data measured from the closet CD target. The simulated edge placement error data after calibration can be ranked and the locations with higher edge placement errors or prone to being short or open can be identified as critical hot spots.

In another embodiment, the data correlation may be based on the circuit patterns between the two sets of data. A design clip represents circuit patterns of a region centered at a location on the chip. According to the present invention, the data analytics extracts the design clip from the design data for the location of each entry in the simulated edge placement error data. The design clip of each CD target can also be obtained based on its circuit pattern type or extracted from the design data according to the CD target Location.

For each entry in the edge placement error data, the design clip of the CD target that has highest correlation with the design clip of the entry location can be identified. The simulated edge placement error data can be calibrated according to the CD error data measured from the CD target with the highest design clip correlation. The design clip correlation can be determined based on simulated images modelled and rendered from the design clips or design features such as number of vertices, polygons or lines in different orientations, or any of their combinations.

In another embodiment, the correlation may also take into account the design patterns of the underneath layers. In other words, the design clips extracted for the CD targets and the edge placement error locations may include the design clips of the layers under the current layer. Although it may be possible to include underneath layer or structure in simulating edge placement error, the complexity in the simulation makes it very tedious and difficult to achieve accurate result. Therefore, by including design clips of the underneath layers in the correlation, the calibrated simulated edge placement error data should be able to reflect the impact of the previous layers and better predict critical hot spots.

Although a couple of exemplary embodiments have been described above for correlating wafer physical measurement with digital simulation, many others can be applied in the data analytics of the present invention. The wafer physical measurement may also include physical images such as optical or SEM images. Simulated images may also be modelled and generated from the design clips. Data correlation can be based on design features, polygon characteristics or image characteristics extracted from the physical image or the simulated image. It is also feasible to do pattern correlation based on direct image correlation between simulated image and physical image.

It may be worth pointing out that there are many techniques known in the art for determining correlation between two sets of data such as features, design clips or images. One exemplary approach is to compute the normalized cross correlation coefficient between the two sets of data. Another exemplary approach is to compute the sum of the square difference between the two sets of data. All those approaches are applicable to the data correlation in the present invention and the proper technique can be selected to provide most accurate correlation results.

As described above, critical hot spots determined by the data analytics according to FIG. 2 of the present invention after the CD data have been measured from CD targets can be used for in-line wafer monitoring in manufacturing the semiconductor device. Smart sampling for wafer inspection can be based on the critical hot spots determined by the data analytics to more efficiently utilize wafer inspection resources. To cope with wafer to wafer variation and achieve even more benefit, the data analytics can also be included in-line while wafer metrology and inspection are ongoing as shown in FIG. 4.

Figure 4:
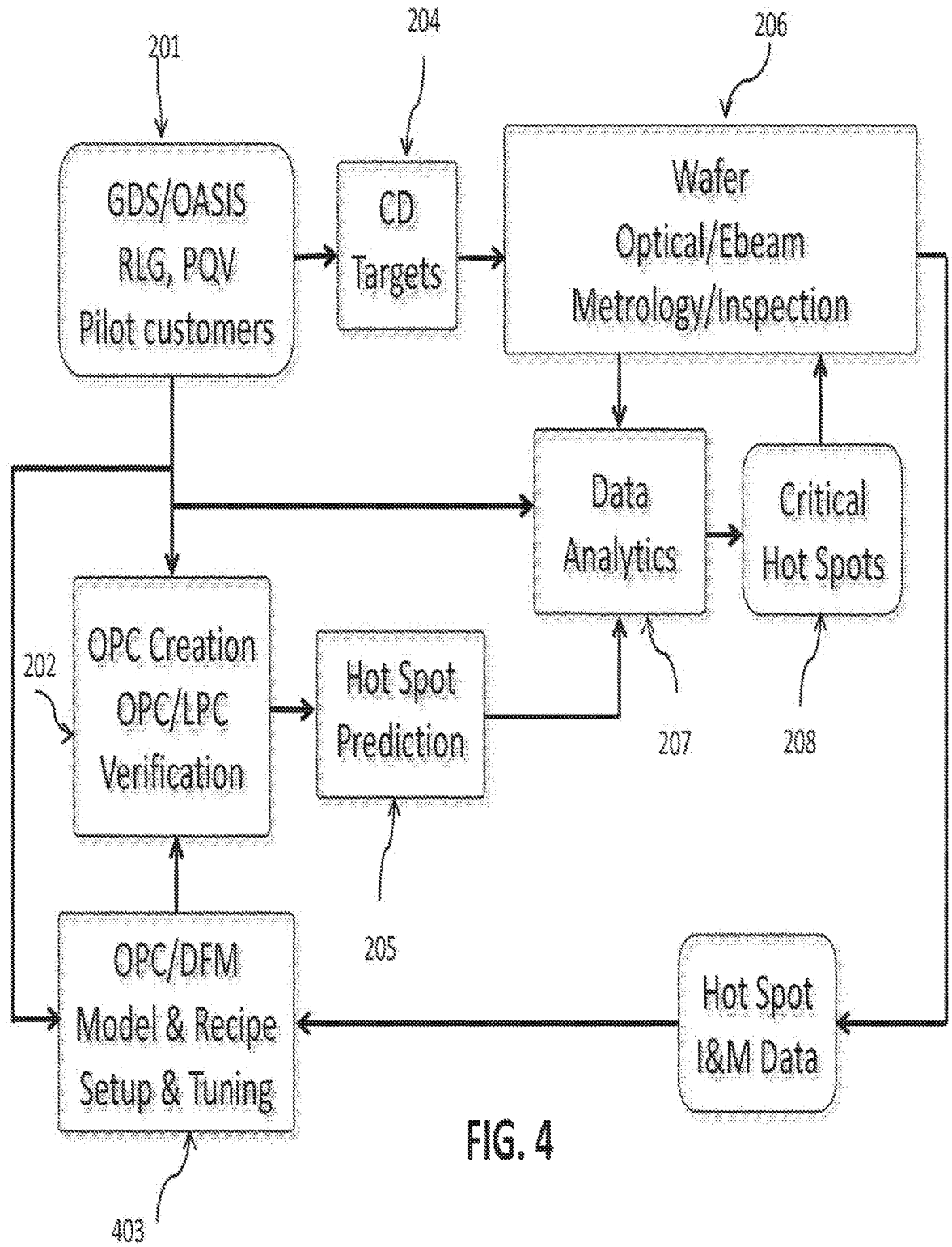
FIG. 4 shows a block diagram for in-line hot spot generation and monitoring using data analytics of the present invention for initial setup and on-going tuning for optimizing the lithography process of manufacturing semiconductor devices.

With reference to FIG. 4, a wafer process monitoring tool can be designed to provide both inspection and metrology capabilities. Once the CD data are measured by the metrology, the data analytics 207 can determine critical hot spots that can be identified based on the available CD data and the predicted edge placement error data. Hot spot wafer inspection can be performed on the same wafer process monitoring tool immediately to speed up the time to result in detecting systematic defects that may significantly impact the yield of manufacturing the semiconductor device.

According to the present invention, as soon as the CD data are available for CD targets, the data analytics 207 can perform data correlation and correction with the simulated edge placement error data. One advantage of performing data analytics in-line is that hot spots can be determined dynamically according to process variation detected by the CD measurement. Optical or e-beam inspection can be performed on the same wafer process monitoring tool based on the hot spots of the wafer determined by the data analytics without having to unload the wafer.

As shown in FIG. 4, the results of the CD data and inspection data can also be fed back for tuning the OPC and DFM model in the initial setup or ongoing tuning 403 for optimizing the lithography process of manufacturing semiconductor devices. The data analytics 207 is performed while the wafer metrology and inspection are ongoing. With the CD data measured from wafer in line, the OPC/DFM model and recipe can be better tuned to take into account the variation and errors that are introduced in the manufacturing process but cannot be predicted by the modelling.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A method for improving semiconductor device fabrication during a manufacturing process, comprising:
providing a recipe to manufacture a semiconductor device, the recipe comprising design data of the semiconductor device and a manufacturing process configuration;
predicting a hot spot candidate in a simulation, based on an edge placement error prediction in multiple layers of the design data;
processing a substrate to produce the semiconductor device according to the recipe during the manufacturing process;
measuring critical dimensions of the semiconductor device, to produce measured critical dimension data during the manufacturing process;
correlating the measured critical dimension data to the predicted hot spot candidate using multiple layers of the design data, to generate critical hot spot data that identifies a process variation that results in a linewidth and a location, wherein the correlation is determined based on design features and image characteristics extracted from the measurement and the predicted hot spot candidate;
modifying the recipe based on the the identified process variation result in the linewidth and the location during the manufacturing process; and
processing a second substrate using the modified recipe during the manufacturing process to produce a second semiconductor device.

2. The method of claim 1 further comprising monitoring the processing of the second substrate based on the critical hot spot data.

3. The method of claim 1 wherein predicting the hot spot candidate further comprises simulating the hot spot candidate based on a predicted edge placement error of the design data.

4. The method of claim 3 wherein the predicting the hot spot candidate is based on location proximity of between two or more elements of the design data.

5. The method of claim 4 wherein predicting the hot spot candidate is further based on a second layer of the design data.

6. The method of claim 1 wherein measuring critical dimensions of the semiconductor device includes obtaining an image of the semiconductor device.

7. The method of claim 6 wherein predicting the hot spot candidate further comprises creating a simulated image, and correlating the critical dimension data and hot spot candidate comprises comparing image of the semiconductor device to the simulated image.

8. A non-transitory computer readable medium comprising instructions that, when executed by a processor of a processing system during a manufacturing process, cause the processing system to:
provide a recipe to manufacture a semiconductor device, the recipe comprising design data of the semiconductor device and a manufacturing process configuration;
predict a hot spot candidate in a simulation, based on an edge placement error prediction in multiple layers of the design data;
process a substrate to produce the semiconductor device according to the recipe during the manufacturing process;
measure critical dimensions of the semiconductor device, to produce measured critical dimension data during the manufacturing process;
correlate the measured critical dimension data to the predicted hot spot candidate using multiple layers of the design data, to generate critical hot spot data that identifies a process variation that results in a linewidth and a location, wherein the correlation is determined based on design features and image characteristics extracted from the measurement and the predicted hot spot candidate;
modify the recipe based on the identified process variation result in the linewidth and the location during the manufacturing process; and
process a second substrate using the modified recipe during the manufacturing process to produce a second semiconductor device.

9. The non-transitory computer readable medium of claim 8 further cause the processing system to monitor the processing of the second substrate based on the critical hot spot data.

10. The non-transitory computer readable medium of claim 8 wherein the instructions that cause the processing system to predict the hot spot candidate further causes the processing system to simulate the hot spot candidate based on a predicted edge placement error of the design data.

11. The non-transitory computer readable medium of claim 10 wherein the predicted hot spot candidate is based on location proximity of between two or more elements of the design data.

12. The non-transitory computer readable medium of claim 11 wherein the instructions that cause the processing system to predict the hot spot candidate is further based on a second layer of the design data.

13. The non-transitory computer readable medium of claim 8 wherein the instructions that cause the processing system to measure critical dimensions of the semiconductor device includes obtaining an image of the semiconductor device.

14. The non-transitory computer readable medium of claim 13 wherein the instructions that cause the processing system to predict the hot spot candidate further comprises computer-readable instructions that cause the processing system to create a simulated image, and correlating the critical dimension data and hot spot candidate comprises comparing of the image of the semiconductor device to the simulated image.

15. A system for improving semiconductor device fabrication during a manufacturing process, comprising:
a memory comprising computer-executable instructions;
a processor configured to execute the computer-executable instructions and cause the system to:
provide a recipe to manufacture a semiconductor device, the recipe comprising design data of the semiconductor device and a manufacturing process configuration;

predict a hot spot candidate in a simulation, based on an edge placement error prediction in multiple layers of the design data;

process a substrate to produce the semiconductor device according to the recipe during the manufacturing process;

measure critical dimensions of the semiconductor device, to produce measured critical dimension data during the manufacturing process;

correlate the measured critical dimension data to the predicted hot spot candidate using multiple layers of the design data, to generate critical hot spot data that identifies a process variation that results in a linewidth and a location, wherein the correlation is determined based on design features and image characteristics extracted from the measurement and the predicted hot spot candidate;

modify the recipe based on the identified process variation result in the linewidth and the location during the manufacturing process; and process a second substrate using the modified recipe during the manufacturing process to produce a second semiconductor device.

16. The system of claim 15, the computer-executable instructions further cause the system to monitor the processing of the second substrate based on the critical hot spot data.

17. The system of claim 15 wherein the computer-executable instructions that cause the system to predict the hot spot candidate further cause the system to simulate the hot spot candidate based on a predicted edge placement error of the design data.

18. The system of claim 17 wherein the predicted hot spot candidate is based on location proximity of between two or more elements of the design data.

19. The system of claim 17 wherein the computer-executable instructions that cause the system to predict the hot spot candidate is further based on a second layer of the design data.

20. The system of claim 15 wherein the computer-executable instructions that cause the system to measure critical dimensions of the semiconductor device includes obtaining an image of the semiconductor device.

* * * * *